(12) United States Patent
Nandakumar et al.

(10) Patent No.: US 11,616,058 B2
(45) Date of Patent: Mar. 28, 2023

(54) SEMICONDUCTOR DEVICE WITH DIFFUSION SUPPRESSION AND LDD IMPLANTS AND AN EMBEDDED NON-LDD SEMICONDUCTOR DEVICE

(71) Applicant: Texas Instruments Incorporated, Dallas, TX (US)

(72) Inventors: Mahalingam Nandakumar, Richardson, TX (US); Brian Edward Hornung, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 53 days.

(21) Appl. No.: 17/117,421

(22) Filed: Dec. 10, 2020

(65) Prior Publication Data

US 2022/0189954 A1   Jun. 16, 2022

(51) Int. Cl.

| | |
|---|---|
| *H01L 27/088* | (2006.01) |
| *H01L 21/225* | (2006.01) |
| *H01L 21/265* | (2006.01) |
| *H01L 21/266* | (2006.01) |
| *H01L 21/8234* | (2006.01) |

(Continued)

(52) U.S. Cl.
CPC ........ *H01L 27/088* (2013.01); *H01L 21/2253* (2013.01); *H01L 21/266* (2013.01); *H01L 21/26513* (2013.01); *H01L 21/26586* (2013.01); *H01L 21/823418* (2013.01); *H01L 29/0847* (2013.01); *H01L 29/66492* (2013.01); *H01L 29/7833* (2013.01)

(58) Field of Classification Search
CPC ..... H01L 21/823462; H01L 21/823412; H01L 29/66492; H01L 29/7833–7836; H01L 29/78621–78627; H01L 29/66537; H01L 2029/7863; H01L 21/823493; H01L 29/1054; H01L 29/0843–0891; H01L 29/66636–66643; H01L 21/823418–823425; H01L 21/823814; H01L 21/823807; H01L 29/1041–1045; H01L 29/66575–66598; H01L 29/66659; H01L 29/7835; H01L 29/78624; H01L 21/2253; H01L 21/26513; H01L 21/26586; H01L 21/26506
See application file for complete search history.

(56) References Cited

U.S. PATENT DOCUMENTS 6,013,546 A * 1/2000 Gardner .......... H01L 21/823814
438/528
7,557,022 B2   7/2009 Nandakumar et al.
(Continued)

*Primary Examiner* — Sonya McCall-Shepard
(74) *Attorney, Agent, or Firm* — Jacqueline J. Garner; Frank D. Cimino

(57) ABSTRACT

The present disclosure provides a method for forming a semiconductor device containing MOS transistors both with and without source/drain extension regions in a semiconductor substrate having a semiconductor material on either side of a gate structure including a gate electrode on a gate dielectric formed in a semiconductor material. In devices with source/drain extensions, a diffusion suppression species of one or more of indium, carbon and a halogen are used. The diffusion suppression implant can be selectively provided only to the semiconductor devices with drain extensions while devices without drain extensions remain diffusion suppression implant free.

22 Claims, 3 Drawing Sheets

(51) Int. Cl.
    *H01L 29/08*     (2006.01)
    *H01L 29/66*     (2006.01)
    *H01L 29/78*     (2006.01)
    *H01L 29/10*     (2006.01)

(56) References Cited

U.S. PATENT DOCUMENTS

| | | | |
|---|---|---|---|
| 8,558,310 B2 | 10/2013 | Nandakumar et al. | |
| 2009/0166685 A1* | 7/2009 | Hokazono | H01L 29/7833 |
| | | | 257/E21.466 |
| 2009/0283842 A1* | 11/2009 | Hokazono | H01L 21/823412 |
| | | | 257/E27.061 |
| 2013/0187227 A1* | 7/2013 | Nandakumar | H01L 29/4916 |
| | | | 438/275 |
| 2018/0286950 A1* | 10/2018 | Fujii | H01L 29/66575 |

* cited by examiner

US 11,616,058 B2

SEMICONDUCTOR DEVICE WITH DIFFUSION SUPPRESSION AND LDD IMPLANTS AND AN EMBEDDED NON-LDD SEMICONDUCTOR DEVICE

FIELD

This disclosure relates to the field of semiconductor devices. More particularly, this disclosure relates to transistors in semiconductor devices.

BACKGROUND

Semiconductor devices have historically undergone technological advances in materials and designs which have produced generations of semiconductor devices where each succeeding generation contains smaller and more complex circuits than the previous generation. As the critical dimensions (CD's) of the finest features of a semiconductor device become smaller, the control of implant profiles in semiconductor devices which contain both devices with lightly doped drain (LDD) implants and without LDD implants becomes more difficult.

Additionally, as generations of semiconductor devices undergo technical advances, there is a desire to incorporate more types of semiconductor functionality on the same semiconductor substrate. For example, it may be desirable to fabricate a semiconductor device which contains both complementary metal oxide semiconductor (CMOS) devices and analog devices. There is a need to achieve integration of both types of semiconductor devices even though they have different specification metrics.

SUMMARY

The present disclosure introduces a semiconductor device which includes a first transistor and a second transistor of the same polarity. The first transistor has a lightly doped drain (LDD) region and a diffusion suppressant region with a diffusion suppressant species partially or completely overlapping the LDD region. The second transistor is free of an LDD region and free of a diffusion suppressant region. The disclosure includes a method to form the first transistor and the second transistor. A first source/drain region of the first transistor and a second source/drain region of the second transistor are formed concurrently.

DETAILED DESCRIPTION

Figure 1A:
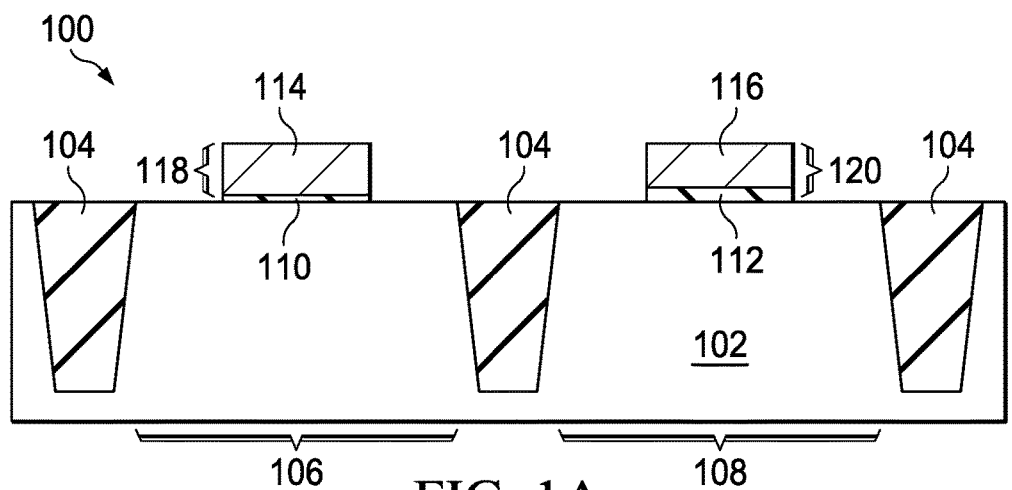
FIG. 1A through FIG. 1E are cross sections of a microelectronic device at various steps in the formation of a transistor which includes implanting LDD species and diffusion suppression species, and the formation of a second transistor which is free of LDD implants and diffusion suppression species implants.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In this disclosure and the claims that follow, unless stated otherwise and/or specified to the contrary, any one or more of the layers set forth herein can be formed in any number of suitable ways, such as with spin-on techniques, sputtering techniques (e.g., Magnetron and/or ion beam sputtering), (thermal) growth techniques or deposition techniques such as chemical vapor deposition (CVD), physical vapor deposition (PVD), PECVD, or atomic layer deposition (ALD), for example. As another example, silicon nitride may be a silicon-rich silicon nitride or an oxygen-rich silicon nitride. Silicon nitride may contain some oxygen, but not so much that the materials dielectric constant is substantially different from that of high purity stoichiometric silicon nitride.

It is noted that terms such as top, bottom, and under may be used in this disclosure. These terms should not be construed as limiting the position or orientation of a structure or element, but should be used to provide spatial relationship between structures or elements.

As the critical dimensions of semiconductor devices become smaller and the desire to integrate transistors with multiple characteristics on the same semiconductor substrate increases, diffusion control of different types of transistors on a single semiconductor substrate becomes more difficult. For example, if a device contains complementary metal oxide semiconductor (CMOS) devices and analog devices, minimization of drain induced barrier lowering (DIBL) and short channel effects (SCE) are performance metrics where minimum diffusion of source/drain implants are desired, while for analog devices, more diffusion of source/drain implants can be desired to lower resistance between source and drain (Rsd).

Shown in FIG. 1A through FIG. 1E are example cross section figures describing a method of forming a semiconductor device 100 that forms metal oxide semiconductor (MOS) transistors. Although n-channel metal oxide semiconductor (NMOS) transistors are described herein, this information that can be used to form p-channel metal oxide semiconductor (PMOS) transistors when n-doped regions are substituted by p-doped regions. Likewise, p-doped regions are substituted by n-doped regions. In this example, first conductivity type refers to n-type, and second conductivity type refers to p-type.

Referring to FIG. 1A, the semiconductor device 100 is formed on a semiconductor substrate 102. In this example, the semiconductor substrate 102 has the second conductivity type, which is p-type for forming NMOS transistors. The semiconductor device 100 is shown at a point in the process flow after shallow trench isolation (STI) 104, first gate dielectric 110, second gate dielectric 112, first gate electrode 114 and second gate electrode 116 have been formed on the semiconductor substrate 102. The first gate dielectric 110 and the second gate dielectric 112 may be of the same or may be of different thicknesses to allow devices having different supply voltage tolerances (e.g., 1.8 V and 3.3 V devices) between core transistor and non-core transistor input/output (I/O) devices. The first gate dielectric 110 and the second gate dielectric 112 can be formed to a thickness of about 1 nanometer or more, and can have an equivalent oxide thickness (EOT) of about 1 nanometer or less, by way of example, while the first gate electrode 114 and the second gate electrode 116 can be formed at a thickness of about 50 to 100 nanometers, for example. These steps form the first gate structure 118 and the second gate structure 120. The first gate structure 118 includes the first gate dielectric 110 and the first gate electrode 114. The second gate structure 120 includes the second gate dielectric 112 and the second gate electrode 116.

Additionally, the first gate electrode 114 and second gate electrode 116 generally includes doped polysilicon, SiGe, or metal, and the first gate dielectric 110 and second gate dielectric 112 can comprise silicon oxide or a high-k dielectric material, for example. A dielectric material having a k value of about 7.8 and a thickness of 10 nm, for example is substantially electrically equivalent to a silicon oxide gate dielectric having a k value of about 3.8 and a thickness of 5 nm. The first gate dielectric 110 and the second gate dielectric 112 may include any one or more of the following, either alone or in combination: silicon dioxide ($SiO_2$), aluminum oxide ($Al_2O_3$), zirconium silicate, hafnium silicate, hafnium silicon oxynitride, hafnium oxynitride, zirconium oxynitride, zirconium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate, barium strontium oxide, barium titanate, strontium titanate, and $PbZrO_3$.

Figure 1B:
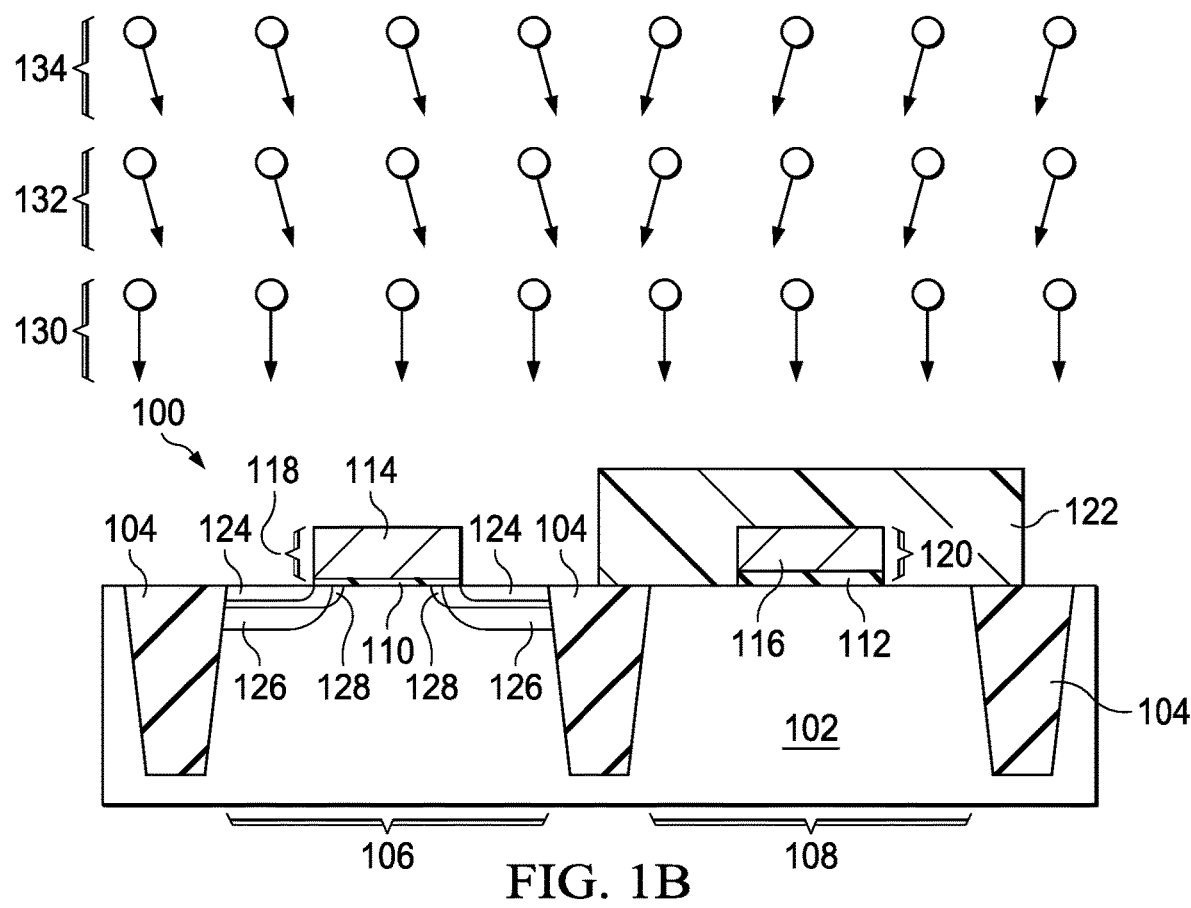

Referring to FIG. 1B, a lightly doped drain (LDD) photomask 122 is deposited which serves the function of allowing a LDD implant 130, a diffusion suppression implant 132 and a halo implant 134 in a first area for the first transistor 106. The LDD photomask 122 also masks devices in a second area for the second transistor 108, the region to be free of the LDD implant 130, diffusion suppression implant 132 and halo implant 134. The LDD photomask 122 may include a light sensitive organic material which is coated, exposed and developed. The LDD photomask 122 processing operation is followed by the LDD implant 130 to form the LDD implant region 124 by implanting a first dose of first conductivity type dopants into the semiconductor substrate 102 adjacent to the first gate electrode 114, wherein the first dose of first conductivity type dopants is blocked from the semiconductor material under the first gate electrode 114 by the first gate electrode 114 and is blocked from the semiconductor material in the area for the second transistor 108 by the LDD photomask 122. In this example, the first conductivity type dopants are n-type dopants, and may include phosphorus, arsenic, or antimony. In addition to the LDD implant 130, a diffusion suppression implant 132 including at least one of indium, carbon or a halogen species and a halo implant 134, (implants may or may not be in the stated order) are implanted while the LDD photomask 122 is in place. The LDD implant region 124 extends from the edge of the STI 104 to a first location under the first gate electrode 114, and forms a first source/drain extension region. In one example embodiment, the LDD implant 130 implanted into the semiconductor substrate 102 may contain an implant of arsenic, phosphorus, or antimony ($5\times10^{13}/cm^2$ to $5\times10^{15}/cm^2$/1-8 keV/0-15° tilt). These implants have an implant angle of 0°. The diffusion suppression implant 132 is implanted into the semiconductor substrate 102 wherein the average concentration of carbon is ($1\times10^{13}$ $cm^{-2}$ to $1\times10^{15}$ $cm^{-2}$/2-10 keV/0-45° tilt), of fluorine is ($1\times10^{13}/cm^2$ to $1\times10^{15}/cm^2$/2-20 keV/0-45° tilt), or nitrogen which can range from ($1\times10^{13}/cm^2$ to $1\times10^{15}/cm^2$/2-20 keV/0-45° tilt). The carbon, nitrogen, or fluorine of the diffusion suppression implant 132 forms a diffusion suppression region 126 in the semiconductor substrate 102. To form the halo implant region 128, second conductivity type dopants are implanted into the semiconductor substrate 102 by the halo implant 134, at a tilt angle of 5 degrees to 30 degrees, into the semiconductor substrate 102 adjacent to the first gate electrode 114 while the LDD photomask 122 in place, wherein the second conductivity type dopants are blocked from the semiconductor substrate 102 under the first gate electrode 114 by the first gate electrode 114 and are blocked from the semiconductor substrate 102 in the area for the second transistor 108 by the LDD photomask 122.

For the halo implant 134, the boron, indium and/or boron di-fluoride ($BF_2$) may be implanted at respective doses of between about $5\times10^{12}/cm^2$ and about $5\times10^{14}/cm^2$, for example, where the different dopant species are implanted separately. The boron may, for example, be implanted at an energy of between about 5 keV and about 20 keV, the indium may be implanted at an energy of between about 20 keV and about 100 keV, and the boron di-fluoride may be implanted at an energy of between about 20 keV and about 1.00 keV, for example. Similarly, the arsenic of the LDD implant 130 may, for example, be implanted at an energy of between about 1 keV and about 4 keV, the phosphorous of the LDD implant 130 may be implanted at an energy of between about 1 keV and about 8 keV, and the antimony of the LDD implant 130 may be implanted at an energy of between about 5 keV and about 40 keV, for example. At these energies, the LDD implant region 124 is formed at a depth between 100 Angstroms and 450 Angstroms, the halo implant region 128 is formed at a depth of between 100 Angstroms and 600 Angstroms, and the diffusion suppression region 126 is formed at a depth of 50 Angstroms to 600 Angstroms, by way of example. The diffusion suppression region 126 partially or completely overlaps the LDD implant region 124.

Figure 2:
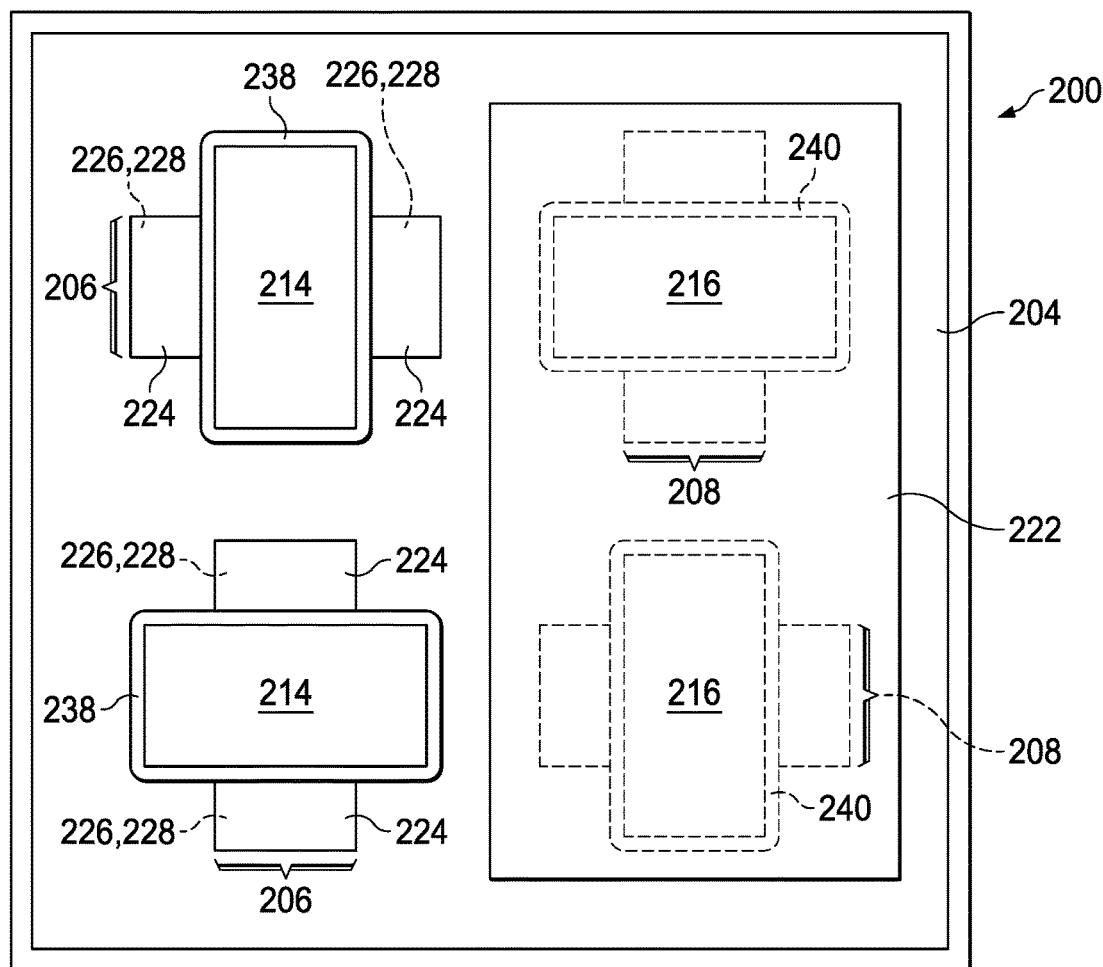
FIG. 2 is a top down drawing at the LDD implant process step showing two devices which are open to the LDD implant, diffusion suppression implant, and halo implant, while two other devices are blocked from receiving the LDD diffusion implant, suppression implant, and halo implant by a resist layer.

FIG. 2 shows a top down view of a semiconductor device 200 at the same point in the process flow as FIG. 1B. FIG. 2 shows two first transistors 206 which are implanted with an LDD implant 224, a diffusion suppression implant 226, and a halo implant 228. The other two second transistors 208 are blocked from the LDD implant 224, diffusion suppression implant 226, and the halo implant 228 by a resist layer 222. Other regions shown in FIG. 2 include the STI 204, first sidewall 238, first transistor gate electrode 214, second sidewall 240, and second transistor gate electrode 216. The first two transistors 206 are oriented perpendicular to each other, and the second two transistors 208 are oriented perpendicular to each other.

Figure 1C:
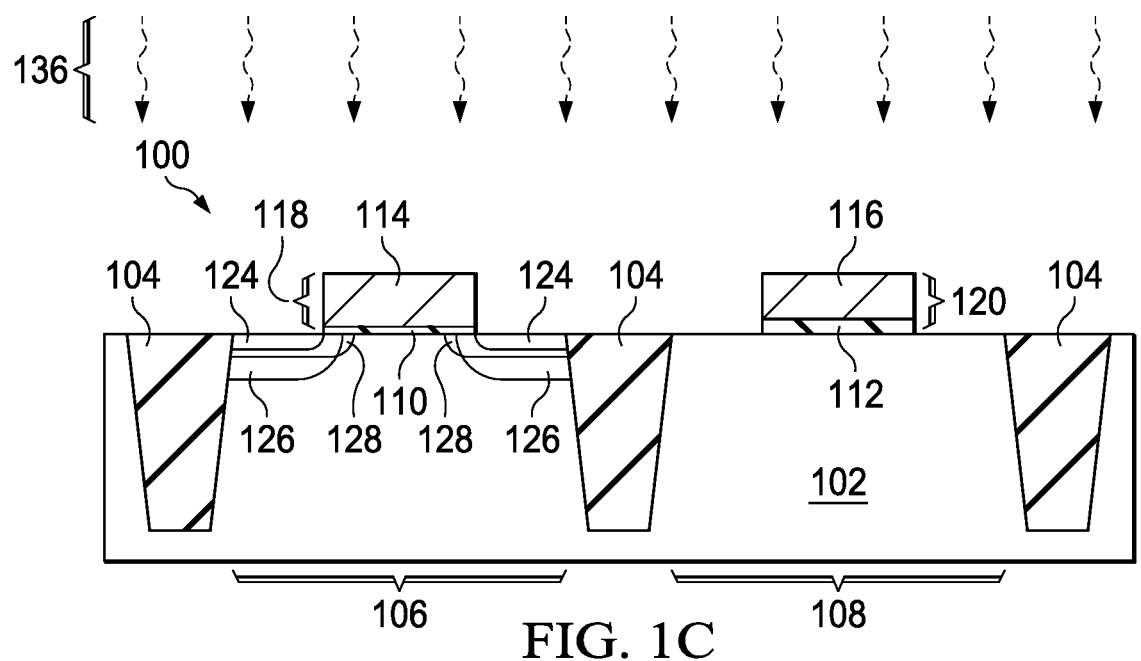

Referring to FIG. 1C, a thermal anneal 136 is applied to the semiconductor device 100 as a damage anneal/dopant activation. The thermal anneal 136 can be a rapid thermal anneal (RTA) which can range from 900° C. to 1050° C. for a time of 20 to 60 seconds, a refined spike anneal (RSA) which can range up to 1180° C. with a ramp to maximum temperature and no dwell time at the max temperature, or an ultra-high temperature (UHT) anneal which can range from a temperature of 1050° C. to 1400° C. for a time less than or equal to 10 seconds. After the thermal anneal 136 is completed, an average concentration of the indium, the carbon and the halogen in the diffusion suppression region 126 may be $1\times10^{18}/cm^3$ to $2\times10^{19}/cm^3$.

Figure 1D:
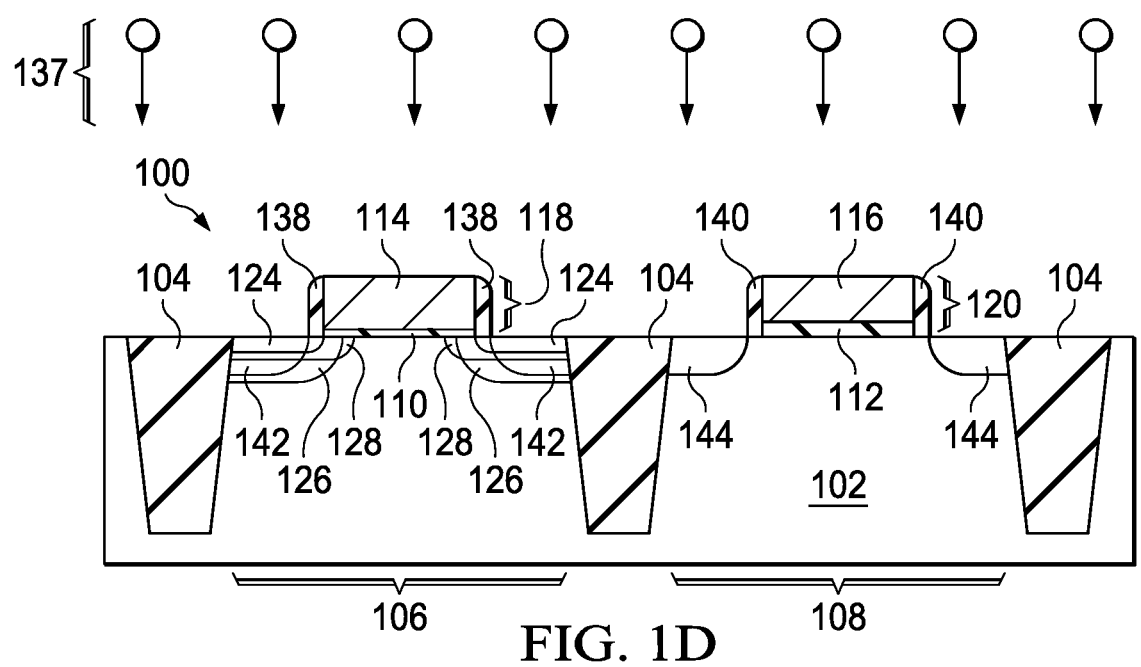
Figure 1E:
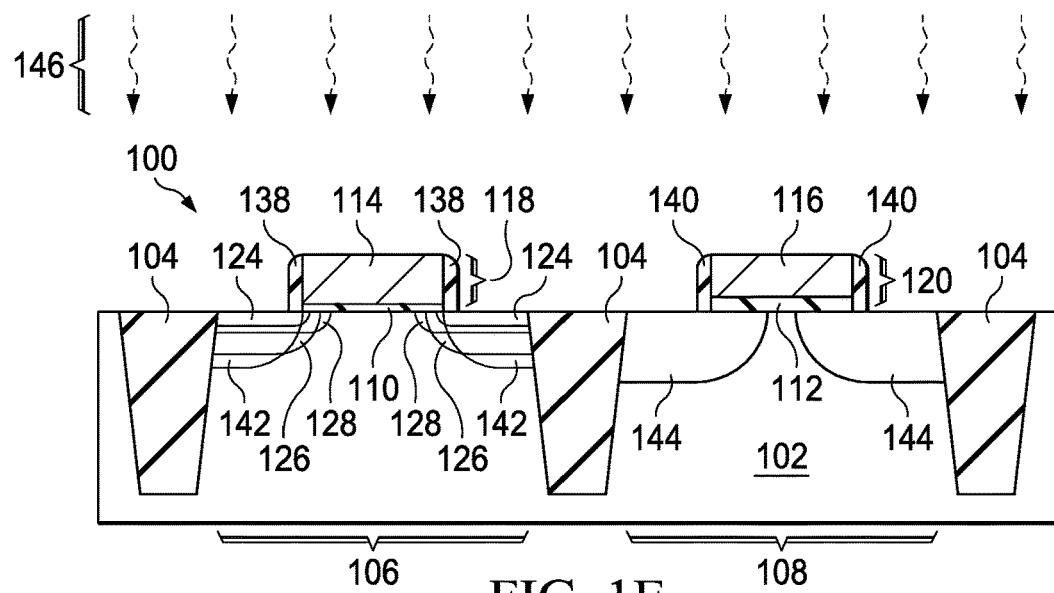

Referring to FIG. 1D, first sidewall spacers 138 and second sidewall spacers 140 are then formed at the edges of the first gate electrode 114 and the second gate electrode 116. The first sidewall spacers 138 and the second sidewall spacers 140 are formed by way of a blanket deposition of the sidewall spacer material and a subsequent blanket etch process (deposition and etch steps not specifically shown). The first sidewall spacers 138 and the second sidewall spacers 140 may have equal compositions and equal lateral thicknesses.

A source/drain implant 137 implants a second dose of first conductivity dopants into the semiconductor substrate 102 adjacent to the first sidewall spacers 138 and adjacent to the second sidewall spacers 140, wherein the second dose of first conductivity type dopants is blocked from the semiconductor substrate 102 under the first gate electrode 114 and the first sidewall spacers 138 by the first gate electrode 114 and the first sidewall spacers 138, and is blocked from the semiconductor substrate 102 under the second gate electrode 116 and the second sidewall spacers 140 by the second gate electrode 116 and the second sidewall spacers 140. An implant of one or more of phosphorus, arsenic, and nitrogen ($5 \times 10^{13}/cm^2$-$8 \times 10^{14}/cm^2$/2-50 KeV) forms a first source/drain region 142 and the second source/drain region 144 into the semiconductor substrate 102. The edge of the first sidewall spacers 138 and the edge of the STI 104 define the first source/drain region 142 for the first transistor 106 and a second location at the edge of the second sidewall spacers 140 and the edge of the STI 104 to define the second source/drain region 144 for a second transistor 108. The source/drain implants are made into the first transistor 106 which contains the LDD implant region 124, the diffusion suppression region 126, and the halo implant region 128. The second transistor 108 also receives the source/drain implants, but the second transistor 108 is free of an LDD implant region 124, diffusion suppression region 126 and halo implant region 128. The average concentration of first conductivity type dopants in the first source/drain region 142 is equal to the average concentration of first conductivity type dopants in the second source/drain region 144. The average concentration of first conductivity type dopants in the first source/drain region 142 may be estimated from a cross section sample of the semiconductor device 100 by measuring the concentration of the first conductivity type dopants across the first source/drain region 142 using scanning capacitance microscopy (SCM) or scanning microwave impedance microscopy (SMIM), adding the measured concentrations to obtain a total concentration, and dividing the total concentration by a measured area of the first source/drain region 142. The average concentration of first conductivity type dopants in the second source/drain region 144 may be estimated by a similar method. Estimates of the average concentration of first conductivity type dopants in the second source/drain region 144 and the average concentration of first conductivity type dopants in the second source/drain region 144 may differ by an amount within tolerances encountered in the SCM and SMIM methods Referring to FIG. 1E, a thermal anneal 146 is applied to the semiconductor device 100 as a damage anneal/dopant activation after source/drain implant 137 for the first transistor 106 and the second transistor 108. The thermal anneal 146 can be a RTA which can range from 900° C. to 1050° C. for a time of 20 to 60 seconds, a RSA which can range up to 1180° C. with a ramp to maximum temperature and no dwell time at the max temperature, or a UHT anneal which can range from a temperature of 1050° C. to 1400° C. for a time less than or equal to 10 seconds. The addition of the diffusion suppression species in the first transistor 106 results in less diffusion of the first source/drain region 142 for the first transistor 106 than the diffusion of the second source/drain region 144 in second transistor 108 which received the same source/drain implant 137 and thermal anneal 146 as the first transistor 106, but did not receive an diffusion suppression implant 132.

The integration strategy of introducing a photolithography operation to allow for formation of a first transistor 106 containing an LDD implant region 124, a diffusion suppression region 126, and a halo implant region 128 for the first transistor 106, while masking the LDD implant region 124, the diffusion suppression region 126, and the halo implant region 128 for the second transistor 108 is advantageous as it allows devices with an LDD implant region 124, diffusion suppression region 126, and halo implant region 128 such as the first transistor 106 to minimize the first source/drain region 142 diffusion to meet operating specifications which require lower drain induced barrier lowering and improved short channel effect performance to be fabricated on the same piece of silicon as the second transistor 108 which do not have the LDD implant region 124, the diffusion suppression region 126, or the halo implant region 128 which results in more second source/drain region 144 diffusion in the second transistor 108 which results in lower Rsd. This allows the first transistor 106 and the second transistor 108 to both meet their transistor specifications by selectively adding a s diffusion suppression region 126 to the first transistor 106 while leaving the second transistor 108 free of the diffusion suppression region 126. An additional advantage of the disclosure is that only a single photomask 122 is needed for the LDD implant 130, halo implant 134, and diffusion suppression implant 132.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:
1. A semiconductor device, comprising:
a semiconductor substrate including a semiconductor material;
a first transistor of a first polarity, the first transistor including:
a first gate structure including a first gate electrode on a first gate dielectric over the semiconductor material;
a first source/drain region in the semiconductor material adjacent to the first gate structure, the first source/drain region having a first conductivity type, the first source/drain region being laterally separated from the first gate electrode; and
a first source/drain extension region in the semiconductor material including:
a lightly doped drain (LDD) implant region having the first conductivity type, the LDD implant region extending from the first source/drain region to a first location under the first gate electrode; and
a diffusion suppression region including a diffusion suppression species, the diffusion suppression region extending from the first source/drain region under the first gate electrode; and a second transistor of the first polarity the second transistor including:
   a second gate structure including a second gate electrode on a second gate dielectric over the semiconductor material; and
   a second source/drain region in the semiconductor material adjacent to the second gate structure, the second source/drain region having the first conductivity type, the second source/drain region extending to a second location under the second gate electrode;
wherein:
   the second transistor is free of a diffusion suppression region; and
   the second transistor is free of an LDD implant region.

2. The semiconductor device of claim 1, wherein the first gate dielectric and the second gate dielectric have an equivalent oxide thickness (EOT) of 1 nanometer or less.

3. The semiconductor device of claim 1, wherein the diffusion suppression species includes a halogen is selected from a group consisting of fluorine and chlorine.

4. The semiconductor device of claim 1, wherein the diffusion suppression region includes a species selected from the group consisting of indium, carbon and a halogen.

5. The semiconductor device of claim 4, wherein an average concentration of the indium, the carbon and the halogen is $1\times10^{18}/cm^3$ to $2\times10^{19}/cm^3$.

6. The semiconductor device of claim 1, wherein the first gate electrode and the second gate electrode include polysilicon.

7. The semiconductor device of claim 1, wherein the first gate electrode and the second gate electrode include a metal and the first gate dielectric and second gate dielectric include a high-k dielectric material.

8. A semiconductor device, comprising:
   a semiconductor substrate including a semiconductor material;
   a first transistor of a first polarity, the first transistor including:
   a first gate structure including a first gate electrode on a first gate dielectric over the semiconductor material;
   a first source/drain region in the semiconductor material adjacent to the first gate structure, the first source/drain region having a first conductivity type, the first source/drain region being laterally separated from the first gate electrode; and
   a first source/drain extension region in the semiconductor material including:
      a lightly doped drain (LDD) implant region having the first conductivity type, the LDD implant region extending from the first source/drain region to a first location under the first gate electrode; and
      a diffusion suppression region including a diffusion suppression species, the diffusion suppression region extending from the first source/drain region under the first gate electrode; and
   a second transistor of the first polarity the second transistor including:
      a second gate structure including a second gate electrode on a second gate dielectric over the semiconductor material; and
      a second source/drain region in the semiconductor material adjacent to the second gate structure, the second source/drain region having the first conductivity type, the second source/drain region extending to a second location under the second gate electrode;
   wherein:
      the second transistor is free of a diffusion suppression region; and
      the second transistor is free of an LDD implant region, wherein the first transistor further includes a halo implant region under the first gate electrode, adjacent to the LDD implant region, the halo implant region having a second conductivity type, opposite from the first conductivity type and wherein the second transistor is free of a halo implant region.

9. The semiconductor device of claim 1, wherein the first conductivity type is n-type.

10. The semiconductor device of claim 1, wherein the first transistor includes first sidewall spacers on lateral surfaces of the first gate electrode, and the second transistor includes second sidewall spacers on lateral surfaces of the second gate electrode.

11. The semiconductor device of claim 10, wherein the first sidewall spacers and the second sidewall spacers have equal compositions and equal lateral thicknesses.

12. A semiconductor device, comprising:
   a semiconductor substrate including a semiconductor material;
   a first transistor of a first polarity, the first transistor including:
   a first gate structure including a first gate electrode on a first gate dielectric over the semiconductor material;
   a first source/drain region in the semiconductor material adjacent to the first gate structure, the first source/drain region having a first conductivity type, the first source/drain region being laterally separated from the first gate electrode; and
   a first source/drain extension region in the semiconductor material including:
      a lightly doped drain (LDD) implant region having the first conductivity type, the LDD implant region extending from the first source/drain region to a first location under the first gate electrode; and
      a diffusion suppression region including a diffusion suppression species, the diffusion suppression region extending from the first source/drain region under the first gate electrode; and
   a second transistor of the first polarity the second transistor including:
      a second gate structure including a second gate electrode on a second gate dielectric over the semiconductor material; and
      a second source/drain region in the semiconductor material adjacent to the second gate structure, the second source/drain region having the first conductivity type, the second source/drain region extending to a second location under the second gate electrode;
   wherein:
      the second transistor is free of a diffusion suppression region;
      the second transistor is free of an LDD implant region;
      the first transistor includes first sidewall spacers on lateral surfaces of the first gate electrode, and the second transistor includes second sidewall spacers on lateral surfaces of the second gate electrode; and
   the first source/drain region extends at least partway under the first sidewall spacers, and does not extend under the first gate electrode; and the second source/drain region extends completely under the second sidewall spacers and extends partway under the second gate electrode.

13. The semiconductor device of claim 1, wherein the average concentration of first conductivity type dopants in the LDD implant region is $5\times10^{18}/cm^3$ to $1\times10^{21}/cm^3$.

14. A semiconductor device, comprising:
a semiconductor device substrate including a semiconductor material;
a first transistor of a first polarity, the first transistor including:
a first gate structure including a first gate electrode on a first gate dielectric over the semiconductor material;
a first source/drain in the semiconductor material adjacent to the first gate structure, the first source/drain region having a first conductivity type, the first source/drain region being laterally separated from the first gate electrode; and
a first source drain extension region in the semiconductor material including;
a lightly doped drain (LDD) implant region having the first conductivity type, the LDD implant region extending from the first source/drain region to a first location under the first gate electrode; and
a diffusion suppression region including a diffusion suppression species, the diffusion suppression region extending from the first source/drain region under the first gate electrode;
a second transistor of a second polarity, oriented perpendicular to the first transistor, the second transistor including:
a second gate structure including a second gate electrode on a second gate dielectric over the semiconductor material; and
a second source/drain region in the semiconductor material adjacent to the second gate structure, the second source/drain region having the first conductivity type, the second source/drain region being laterally separated from the second gate electrode; and
a second source/drain extension region in the semiconductor material including:
a lightly doped drain (LDD) implant region having the first conductivity type, the LDD implant region extending from the second source/drain region to a second location under the second gate electrode; and
a diffusion suppression region including a diffusion suppression species, the diffusion suppression region extending from a second source/drain region under the second gate electrode;
a third transistor of the first polarity, the third transistor including:
a third gate structure including a third gate electrode on a third gate dielectric over the semiconductor material; and
a third source/drain region in the semiconductor material adjacent to the third gate structure, the third source/drain region having the first conductivity type, the third source/drain region extending to a third location under the third gate electrode; and
a fourth transistor of the first polarity, oriented perpendicular to the third transistor, the fourth transistor including:
a fourth gate structure including a fourth gate electrode on the fourth gate dielectric over the semiconductor material; and
a fourth source/drain region in the semiconductor material adjacent to the fourth gate structure, the fourth source/drain region having the first conductivity type, the fourth source/drain region extending to a fourth location under the fourth gate electrode;
wherein:
the third transistor and the fourth transistor are free of a diffusion suppression region; and
the third transistor and the fourth transistor are free of an LDD implant region; and
average concentrations of first conductivity type dopants in the first source/drain region, the second source/drain region, the third source/drain region and the fourth source/drain region are equal.

15. The semiconductor device of claim 14, wherein the first gate dielectric and the third gate dielectric have an equivalent oxide thickness (EOT) of 1 nanometer or less.

16. The semiconductor device of claim 14, wherein the diffusion suppression species includes a halogen is selected from a group consisting of fluorine and chlorine.

17. The semiconductor device of claim 14, wherein the diffusion suppression region includes a species selected from the group consisting of indium, carbon and a halogen.

18. The semiconductor device of claim 14, wherein the first transistor further includes a halo implant region under the first gate electrode, adjacent to the LDD implant region, the halo implant region having a second conductivity type, opposite from the first conductivity type and wherein the third transistor is free of a halo implant region.

19. The semiconductor device of claim 12, wherein the first transistor further includes a halo implant region under the first gate electrode, adjacent to the LDD implant region, the halo implant region having a second conductivity type, opposite from the first conductivity type and wherein the second transistor is free of a halo implant region.

20. The semiconductor device of claim 12, wherein the first gate dielectric and the second gate dielectric have an equivalent oxide thickness (EOT) of 1 nanometer or less.

21. The semiconductor device of claim 12, wherein the diffusion suppression species includes a halogen is selected from a group consisting of fluorine and chlorine.

22. The semiconductor device of claim 12, wherein the diffusion suppression region includes a species selected from the group consisting of indium, carbon and a halogen.

* * * * *